United States Patent [19]

Schnier et al.

[11] Patent Number: 5,412,676
[45] Date of Patent: May 2, 1995

[54] METHOD AND APPARATUS FOR THE DETERMINATION OF THE RELATIVE FREQUENCY OFFSET BETWEEN AN INPUT OPTICAL SIGNAL AND A RESONANCE FREQUENCY OF AN OPTICAL CAVITY

[75] Inventors: Dietmar Schnier, Hanover, Germany; Alan A. Madej, Gloucester; Gary R. Hanes, Ottawa, both of Canada

[73] Assignee: National Research Council of Canada, Ottawa, Canada

[21] Appl. No.: 254,867

[22] Filed: Jun. 6, 1994

[51] Int. Cl.[6] ............................................. H01S 3/13
[52] U.S. Cl. ......................................... 372/32; 372/31; 372/18; 372/22
[58] Field of Search ..................... 372/29, 32, 28, 92, 372/97, 18

[56] References Cited

U.S. PATENT DOCUMENTS

| | | | |
|---|---|---|---|
| 4,103,254 | 7/1978 | Chikami | 372/32 |
| 4,685,111 | 8/1987 | Baer | 378/18 |
| 4,896,324 | 1/1990 | Ball et al. | 372/18 |
| 5,328,409 | 6/1994 | Laskoskie et al. | 372/32 |

Primary Examiner—Léon Scott, Jr.

[57] ABSTRACT

A method and apparatus for stabilizing the relative frequency offset between a laser and a resonant optical cavity is described. Detected spatial mode patterns excited in a coupled nearly confocal resonator are used to derive a correction signal for frequency offset. The method can be applied to stabilizing a diode-cavity pathlength for an optical feedback locked diode laser system.

8 Claims, 7 Drawing Sheets

METHOD AND APPARATUS FOR THE DETERMINATION OF THE RELATIVE FREQUENCY OFFSET BETWEEN AN INPUT OPTICAL SIGNAL AND A RESONANCE FREQUENCY OF AN OPTICAL CAVITY

FIELD OF THE INVENTION

This invention relates to a method and apparatus for detecting the relative intensities of excited transverse modes of an optical signal excited within a resonant cavity. More specifically, the invention relates to a method and apparatus for providing a control signal representative of the relative frequency between the optical signal and the resonant cavity.

BACKGROUND OF THE INVENTION

Semiconductor lasers are increasingly being used in a variety of applications. Often the output signals of these lasers have an unwanted broad spectral line width; in many applications it is necessary to have light of a higher spectral purity, as well as a laser having a stabilized and controlled oscillation center frequency. These constraints have stimulated a plethora of semiconductor laser frequency stabilization techniques.

With the increasing availability of semiconductor lasers of different wavelengths, diode lasers have become very important tools for spectroscopic applications. However, a major disadvantage of diode lasers is their large spectral linewidth, typically tens of megahertz in the free running case. A standard approach to improving the spectral purity of diode lasers has been to use the effect of optical self-locking of the laser to an external Fabry-Pérot cavity. In a typical arrangement, an external optical cavity acts as a frequency selective mirror reflecting light back into a laser if the laser frequency is close to a cavity resonance. A strong sensitivity of the laser output to back reflections normally leads to chaotic behaviour of the laser frequency, but if the laser diode current and the intensity and the phase of the light reflected back into the laser are adjusted properly, the effect of optical self-locking of the laser to the Fabry-Pérot cavity appears. In this case, the spectral linewidth is typically reduced by more than two orders of magnitude relative to that observed with the free-running laser.

The phase of the feedback signal can be controlled with a piezo mounted mirror located between the laser diode and the Fabry-Pérot cavity. Optimum frequency noise reduction occurs when the free running laser frequency $\omega_0$ is close to a cavity resonance $\omega_c$ and the system frequency $\omega$ is tuned with the feedback phase $\phi$ to be equal with $\omega_c$. With a stable current supply and temperature control for the diode laser, the free running laser frequency can be made fairly stable so that stabilization of the feedback phase is the major problem in most experimental setups. A number of techniques have been employed to stabilize $\phi$ all using the condition $\omega = \omega_c$ at the optimum locking point. Some methods use FM locking techniques. These include: a) modulation of the feedback optical path length producing changes of the laser frequency and analysis of the cavity response with lock in techniques or b) by using an FM sideband method in which the injection current is modulated at a high frequency so that modulation sidebands in the output spectrum are created. A detuning of the carrier frequency from the cavity resonance produces a phase shift of the carrier relative to the sidebands and an amplitude modulation in the reflected beam which when demodulated can provide a control signal.

In another technique, the polarization state of the light reflected from the cavity is analyzed while an additional polarizing element inside the cavity produces different complex field reflection coefficients for orthogonal polarizations of the incoming beam. The reflected light is linearly polarized if the frequency is on cavity resonance. Upon detuning, the reflected beam has a circularly polarized component with opposite rotation sense on each side of the resonance. The polarization character of the reflected beam can be detected and used to generate a control signal.

Modulating the system frequency has two disadvantages. First, the additional sidebands or frequency broadening in the laser frequency spectrum make it more complicated to analyze complex spectral data. Second, the laser spectral brightness (and power in the carrier frequency) is reduced.

Polarization analysis techniques for feedback phase stabilization avoid these problems but the need of a polarizing element inside the locking resonator is disadvantageous; the intracavity polarizer must be aligned carefully, making it difficult or impossible to use a stable single block design for the Fabry-Perot cavity; with a perfect alignment, the polarizer will have some losses for the preferred polarization component. Therefore, with this technique it would not be possible to use a very high finesse ($F_c$) resonator and the reachable noise reduction factor $\eta$ would be limited, since $\eta$ is proportional to $1/F_c$.

There are numerous United States patents that disclose optical feedback in semiconductor lasers. Many of these use a Fabry-Perot resonator, such as the one disclosed in the Kaminow U.S. Pat. No. 4,198,115. The following patents are typical: Hadley et al, U.S. Pat. No. 4,751,705 (optical injection in a single end-element of a semiconductor laser array to lock the array output); Smith et al U.S. Pat. No. 4,556,980 (injection locked semiconductor laser using a gas laser produces a narrow linewidth and frequency control); Haus et al U.S. Pat. No. 4,464,759 (semiconductor diode laser with microwave mode locking): Dutcher et al U.S. Pat. No. 4,752,931 (injection seeded Q switch laser with selectively introduced light from a master oscillator); Fujita et al U.S. Pat. No. 4,677,630 (frequency stabilization technique utilizing optical feedback of a fraction of the laser output); Beene et at. U.S. Pat. No. 4,606,031 (electrical-optical feedback to a transducer to change the resonant characteristics within the laser cavity) and, Dahmani et al. U.S. Pat. No. 4,907,237 (optically coupling a semiconductor laser to an external resonator having an optical cavity with a particular resonance frequency, including optical feedback).

The foregoing references illustrate current approaches to the solution of laser stabilization. However, these approaches do not offer the performance with respect to relative simplicity and general applications for frequency stabilization that the present invention provides.

The present invention not only provides a method and apparatus for stabilization using optical feedback to lock a laser to an external cavity, but as well it provides a method and apparatus of stabilization that allows the locking of an external cavity to a laser. A control signal that relates to the spatial pattern of excited transverse modes at the output of the external cavity can be used to control the resonance of the external cavity, or alternatively, can be used to control and stabilize the laser by adjusting an optical feedback signal.

As a particular embodiment of the method, a phase mirror control technique is provided in which a locking signal is generated by comparing the relative intensities of higher order transverse modes excited in a nearly-confocal, locking resonator. The transverse modes are not degenerate in frequency as in the confocal case. As a result, spatial mode patterns inside the cavity change when the system frequency is tuned over the cavity resonances, which occurs for example, if the phase mirror position is changed from the optimum locking point. These mode patterns can be observed in any beam transmitted through the cavity. The difference signal from two photodetectors sensing certain positions in the beam cross section can be used to lock the feedback phase to a point where the intensity of the light reflected back from the cavity into the diode laser reaches its maximum and the linewidth noise factor $\eta$ has a minimum.

The method for feedback phase stabilization does not require any dither on the system frequency or additional optical elements in or outside the locking cavity as is necessary in the stabilization techniques employed thus far. Besides leading to greater simplicity in the realization, this method offers the advantages of no imposed linewidth modulation or broadening, together with the possibility for using very high finesse locking cavities making the technique very suitable for high resolution spectroscopy.

It is an object of the invention, to provide a method for generating a control signal representative of the relative frequency between laser beam and an external resonant cavity.

STATEMENT OF THE INVENTION

In accordance with the invention, there is provided, a method of providing a control signal that is representative of the relative frequency difference between an optical signal and a natural resonance of a resonant cavity comprising the steps of:
  providing the resonant cavity with the optical signal;
  allowing a plurality of transverse modes of the optical signal to become excited within the resonant cavity; and, determining the relative intensity of a plurality of higher order transverse modes that are excited within the cavity.

In accordance with another aspect of the invention, there is provided, an apparatus for providing a control signal characteristic of a relative frequency of an optical signal with a resonance of a resonant cavity, comprising:
  laser means for generating an optical signal;
  a resonant cavity having an input port for receiving the optical signal, and having an output port for receiving the optical signal after it has been excited within the resonant cavity; and,
  means for detecting at a plurality of locations the power of a plurality of excited transverse modes of the optical signal after propagating through and exiting the output port.

Advantageously, the invention provides an inexpensive method for determining the frequency offset of an optical signal relative to the resonance frequency of an optical cavity.

BRIEF DESCRIPTION OF THE DRAWINGS

Exemplary embodiments of the invention will now be described in conjunction with the drawings in which.

DETAILED DESCRIPTION

Figure 1:
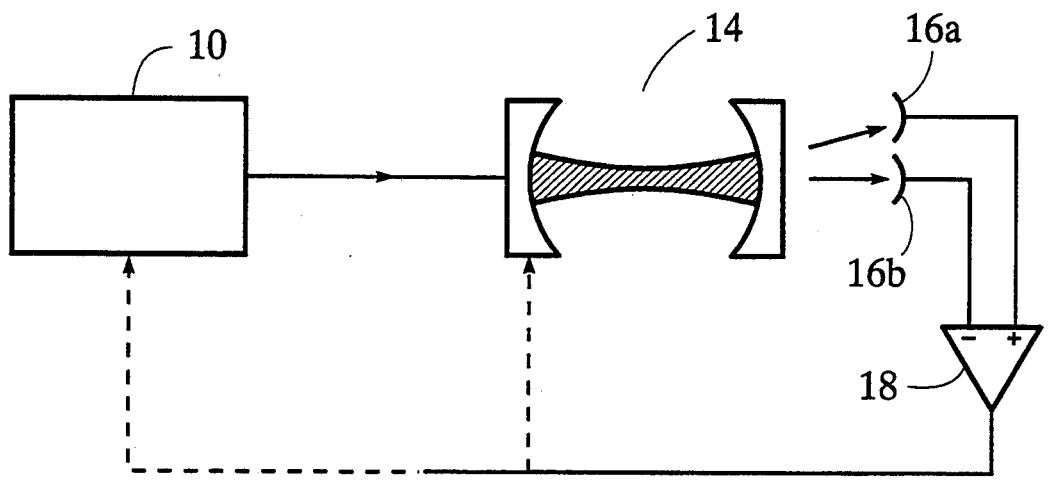
FIG. 1 is a block diagram of an optical system having a resonator cavity, photodetectors adjacent an output port of the cavity and a monochromatic light source adjacent the input of the cavity.

Referring now to FIG. 1, an optical control system is shown that may be configured in one of two modes. The system can be configured (as shown by dotted lines) in a first mode so that a monochromatic light source in the form of a laser, can lock to a Fabry-Pérot resonator cavity's natural frequency, or alternately, in a second mode the cavity can be controlled so that it is locked to the laser's frequency.

Radiation in the form of an optical signal generated by a laser 10 is directed into an input port of a nearly confocal Fabry-Pérot optical resonator cavity 14, (r=1). The transverse modes of the Fabry-Perot resonator cavity 14 are nearly coincident in their resonating frequency, yet they differ by a small amount from each other. Due to the finite resonant frequency widths of each mode, a number of transverse modes, each having different power intensity, can be exited. Two photodetectors 16a and 16b are positioned at locations nearly on axis and farther off axis, respectively. The photodetectors 16a, 16b are positioned to detect the power of the radiation at different locations of an intensity pattern corresponding to the intensity of particular TM modes of the laser radiation upon propagating from the output port and after being exited within the cavity. In order to detect the absence, presence, and intensity of particular modes, the photodetectors are positioned outside the cavity and at different radial locations with respect to the longitudinal axis of the cavity. A differential amplifier 18, is coupled to the photodetectors 16a and 16b to receive electrical signals from the detectors that correspond to the intensity of TM modes of the laser radiation within the cavity 14. In response to these electrical signals the differential amplifier 18 generates a difference signal in the form of a feedback control signal to the resonator or to the laser light source (as is shown by the dotted line) so that resonator may be locked to the laser 10 or conversely, so that the laser may be locked to the resonator cavity 14, respectively, depending upon the configuration of the system. The feedback control signal corresponds to a frequency offset between the laser generated optical signal and the resonance or natural frequency of the cavity 14. Of course, additional circuitry (not shown) is required to receive the feedback control signal and to control the laser's frequency 10 or the resonator cavity's length in response to the control signal, depending on which of the two modes the system is operating in.

Figure 2:
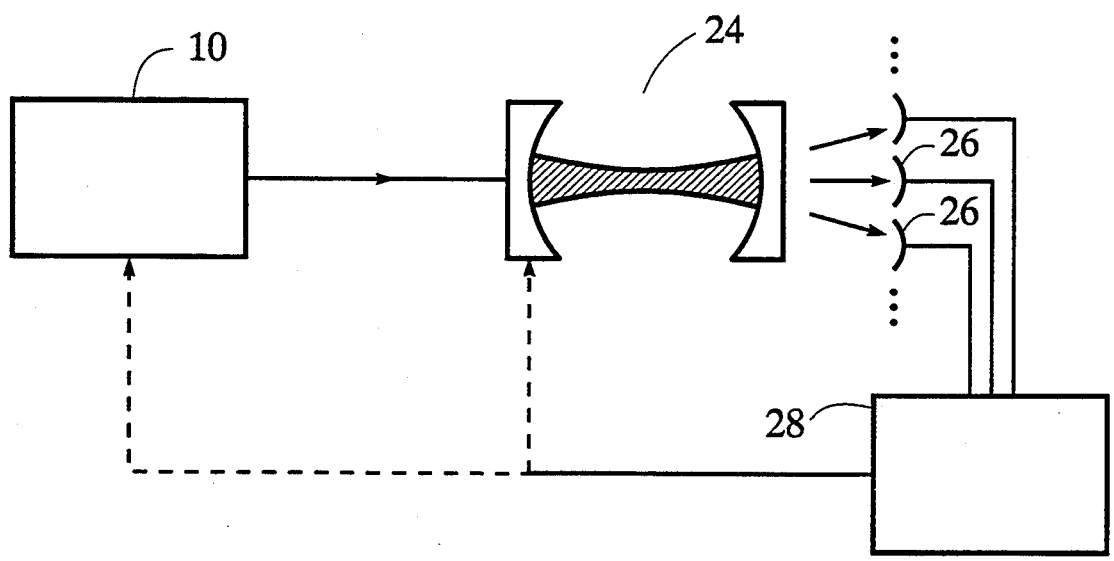
FIG. 2 is a block diagram of the resonating cavity and shown in FIG. 1, including a an array of photodetectors and differential amplifier for providing a control signal . . .

Turning now, to FIG. 2, a circuit similar to that of FIG. 1 is shown. An array of photodetectors 26 is provided for detecting the spatial pattern of the radiation emitted from within the cavity 24. By using more than 2 detectors, more information relating to the spatial pattern can be obtained and thus, the power of particular modes can be more accurately determined. The array of photodetectors 26 generates a plurality of electrical signals proportional to the intensity of the output pattern at particular locations in where the detectors are positioned. A circuit 28 is coupled to the array of detectors to receive and compare the electrical signals on the basis of their relative strengths; the circuit 28 can generates an electrical control signal that corresponds to the difference in the strengths of the electrical signals.

Of course as an alternative to the embodiments shown, the laser source and the resonant control cavity could be incorporated as a part of the same optical resonator structure of the laser source and in which the derived control signal is used to keep the coupled system in resonance.

Figure 3:
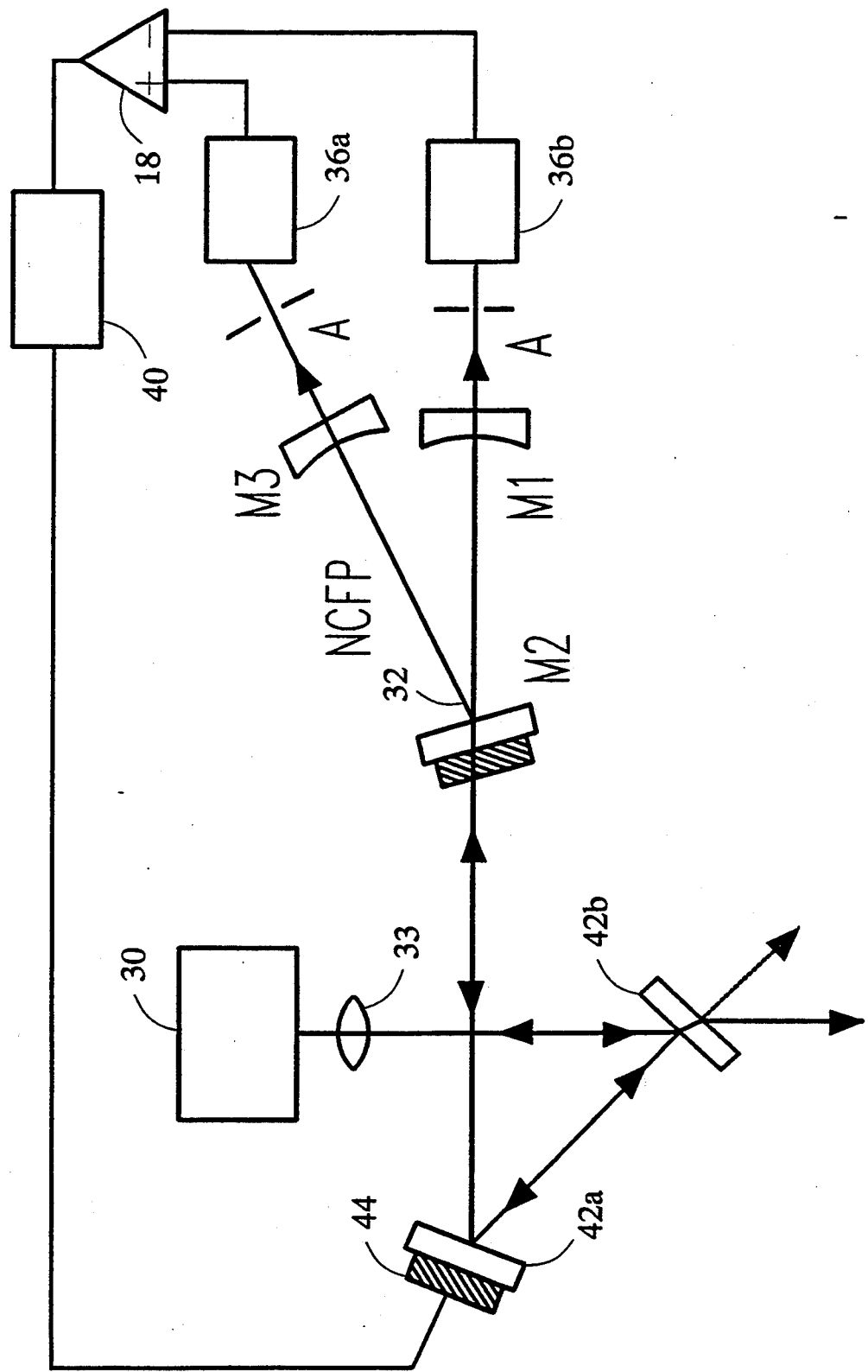
FIG. 3 is a circuit diagram of a system for stabilizing a diode cavity path length.

Referring to FIG. 3, a system is shown, which is part of a device for stabilizing the frequency of a diode laser 30. A folded nearly confocal resonating cavity 32 comprised of mirror M1, M2, and M3 is coupled to the output of the diode laser 30, to receive radiation in the form of an optical output signal from the laser 30 through a lens 33. Two adjustable apertures labeled A provide a select part of the spatial pattern to two photodetectors 36a and 36b that are positioned adjacent the cavity 32 at both ends; the photodetectors are situated at different positions with respect to the longitudinal axis of the cavity to detect the signal power of the radiated spatial pattern produced by excitation of the different transverse modes (TMs) of the output signal at different locations in space. A differential amplifier 18 is coupled to output terminals of the photodetectors 36a and 36b for generating an electrical, difference signal that is integrated, by an integrator 40. A piezoelectric transducer 44 is coupled to the integrator 40 to receive the integrated electrical signal that relates to the relative difference of the excited transverse modes detected by the detectors 36a and 36b. An optical feedback signal generated within the cavity 32 is directed to the laser diode 30 via a mirror arrangement of mirrors 42a and 42b.

In operation, some of the radiation built-up inside the cavity 32, propagates through the mirror M2 that folds the cavity 32, and is then propagates, as the direction of the arrows illustrate, to the laser diode 30. The piezoelectric transducer 44, in dependence upon the integrated electrical signal, changes the length of the optical path, thus altering the signal that is fed back to the laser diode 30. The spatial mode patterns inside the cavity 32 change when the system frequency is tuned over the cavity resonances, which occurs for example, if the phase mirror 42a position is changed from the optimum locking point. The difference signal from the two photodetectors 36a and 36b sensing different positions in the beam cross section, are used to lock the feedback phase to a point where the intensity of the light reflected back from the cavity into the diode laser, reaches its maximum and the linewidth noise factor $\eta$ has a minimum.

A detailed theoretical description of a semiconductor laser coupled to an optical cavity has been presented by Ph. Laurent, A. Clairon, and Ch. Breant, in IEEE J. Quant. Electron. 25, 1131 (1989) and by H. Li and H. R. Telle, in IEEE J. Quant. Electron. 25, 257 (1989). In theoretical models, a Langevin force accounts for the spontaneous emission of photons inside the laser. Assuming a single longitudinal mode laser output and an instantaneous response of the semiconductor material to the light, a system of rate equations for the time dependent behaviour of the intensity, phase, and the spectral density of the diode laser output can be derived. When a high finesse cavity and a high two-way feedback fractional loss $\gamma$ is used, it can be shown that in the steady state solution of these equations the resulting system frequency $\omega$ obeys the equation:

$$\omega = \omega_0 - \frac{\rho\gamma(1-R)(\sin(\omega t_0 + \theta) - R\sin(\omega(t_0 - t_c) + \theta))}{(\cos\theta)(1 - 2R\cos\omega t_c + R^2} \quad (1)$$

In this equation, R is the power reflectivity of the mirror coupling into the cavity, the other mirrors are assumed to be highly reflective. $\rho$ is a laser cavity parameter, $\theta$ is the arctangent of the linewidth broadening factor a, $t_c$ is the resonator round-trip transit time, and $t_0$ is the laser cavity round-trip transit time.

An analysis of equation (1) shows that for detunings of the free running laser frequency from the cavity resonance corresponding to $-0.73$ rad$<(\omega-\omega_c)t_c$ $<0.73$ rad, there are values of the feedback phase $\phi=(\omega_0 t_0)$mod $2\pi$ where $\omega$ is nearly decoupled from $\omega_0$ and locked to the cavity resonance frequency $\omega_c$. Within a certain small locking range, $\omega$ varies with $\phi$ around $\omega_c$ with an approximately linear relation between $\omega$ and $\phi$. For a stable Fabry-Perot cavity, the decoupling of $\omega$ from $\omega_0$ leads to a frequency noise reduction factor $\eta=d\omega/d\omega_0$ relative to the free-running case.

Figures 4A, 4B:
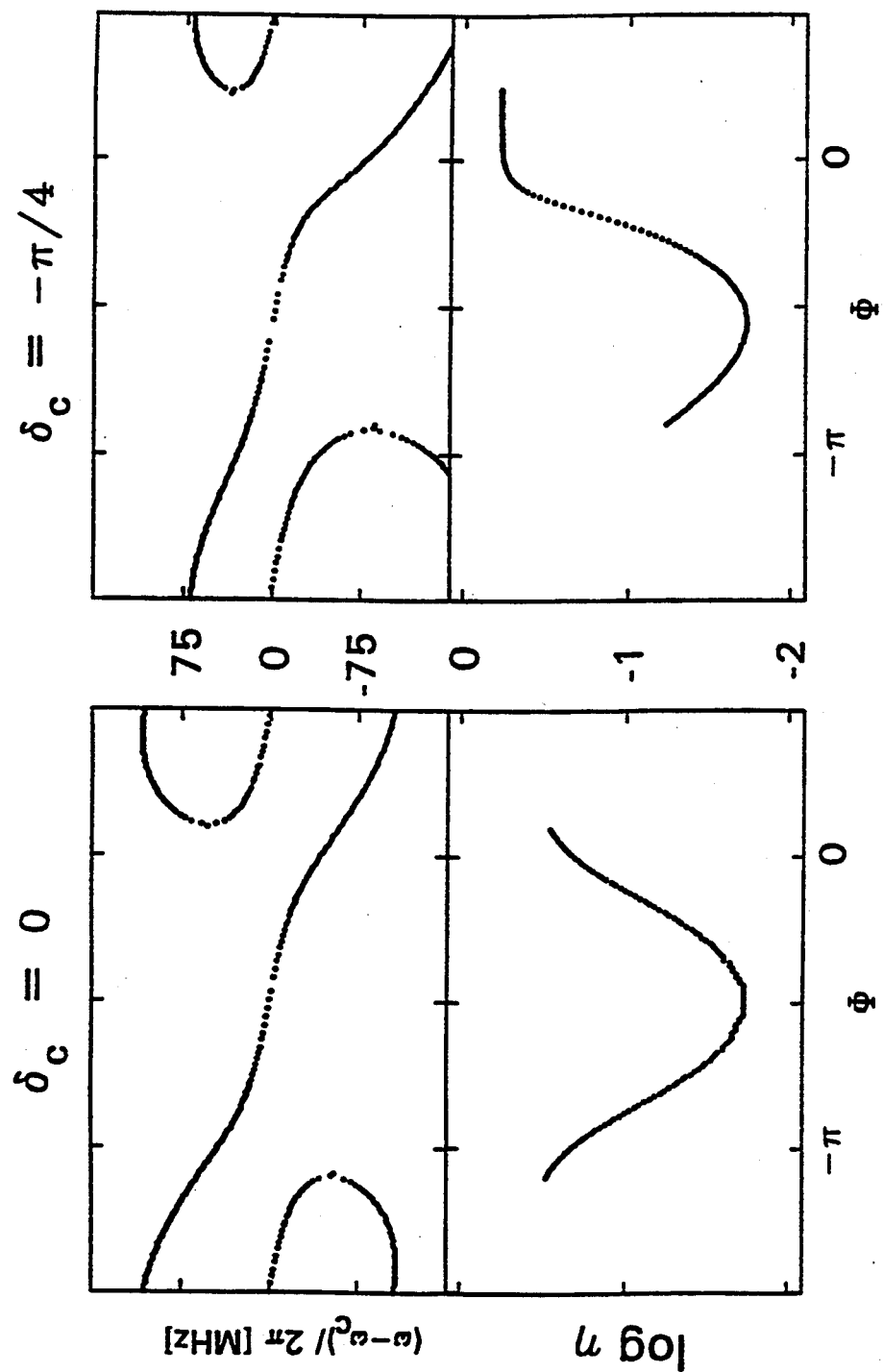
FIGS. 4a and b are graphs of calculated system frequency $\omega$ and noise reduction factor $\eta$ a function of feedback phase $\phi$.

FIG. 4 shows a numerical solution of (1) where $\omega$ and $\eta$ are displayed as a function of the feedback phase $\phi$ with the free running laser frequency $\omega_0$ as a second free parameter. The results illustrate that there is an optimum locking point where the frequency noise reduction factor $\eta$ has its absolute minimum. This occurs when the free running laser frequency $\omega_0$, adjusted with the laser diode current, is equal to the cavity resonance frequency $\omega_c$ and the feedback phase $\phi$ is $\pi/2$ for large values of $\alpha$. At this point the laser system frequency $\omega$ is also equal to $\omega_c$ and $\omega_0$ (FIG. 4a). For a high finesse cavity, (i.e. $R \approx 1$), differentiation of (1) yields, at the optimum locking point:

$$\eta(\omega=\omega_0=\omega_c, R\approx 1)=\frac{\delta\omega}{\delta\omega_0}=\left(1+\frac{\gamma\rho t_c}{(1-R)\cos\theta}\right)^{-1} \quad (2)$$

For sufficiently large values of the feedback parameter $\gamma$, cavity $t_c$ and cavity finesse $Fc \approx$ constant/(1-R), the noise reduction factor is inversely proportional to these quantities. Since the laser system will behave chaotically for $\gamma$ above a relative small value, it is necessary to increase Fc for improved frequency noise reduction. Small values of $\eta$ similar to those in equation (2) can be reached for small laser diode current offsets (,thus changing $\omega_o - \omega_c$) if the system frequency is again adjusted with the feedback phase $\omega$, to be equal to $\omega_c$ (FIG. 4b). In all cases, the frequency noise reaches its minimum at $\omega = \omega_c$ and the problem of optimum feedback phase adjustment can be solved by bringing the frequency deviation $\omega - \omega_c$ to zero.

Figure 5:
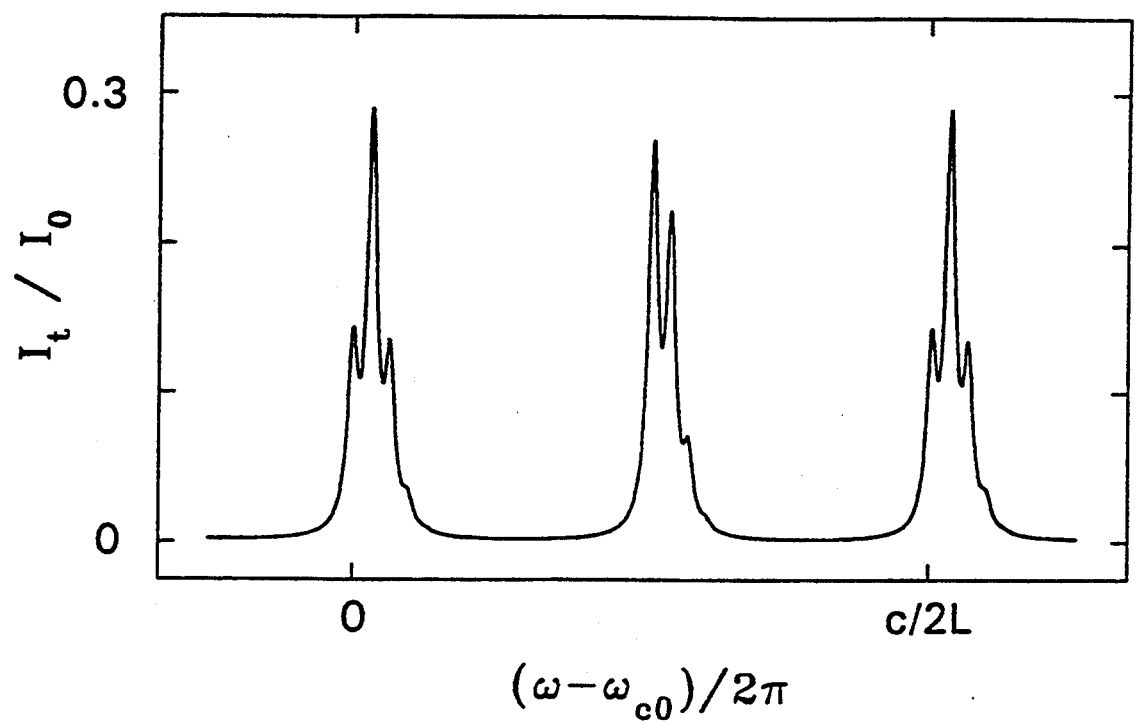
FIG. 5 is a graph of calculated transmitted intensity $I_t$ versus incident intensity $I_o$ for a misaligned, nearly confocal Fabry-Pérot resonator as a function of frequency detuning from the fundamental resonator mode.

If a laser is coupled to a Fabry-Perot resonator with non-perfect mode matching or with a misalignment, higher order transverse modes $TEM_{mn}$ can be excited in the cavity. For example, the simple case of an incoming Gaussian beam with perfect matching of the mode size and position of the beam waist relative to the mirrors, and a misalignment in only one beam direction is considered. Under these assumptions, the number of excited modes can be reduced to the group of modes $TEM_{mn}$ where m=0. In an exactly confocal Fabry-Perot resonator, the frequencies $\omega_{cn}$ of the transverse modes $TEM_{0n}$ are degenerate for even and odd n. This degeneracy vanishes if the mirror radius r is not equal to the length L of the resonator and the frequencies obey the equation:

$$\omega_{cn}=(c/2L)[2\pi(q+1)+2(n+1)\arccos(1-L/r)] \quad (3)$$

where q is the longitudinal mode number. A similar effect can be observed, when a confocal cavity is used far off axis. In this case, the optical path length 2L inside the cavity is altered and the effective mirror radius differs from r because of non-perpendicular reflected beams. With a misaligned incoming beam, the intensity $I_t$ of a transmitted beam leaving a nearly confocal Fabry-Pérot resonator (NCFP) shows two sequences of peaks, one for even and one for odd higher transverse modes, when the frequency is tuned over a full spectral range of the cavity as shown in FIG. 5. The individual height of each peak is given by the coupling coefficient $C_n$ of the corresponding $TEM_{on}$ cavity mode to the incoming beam, $$I_t = I_0 \Sigma I_n, \quad (4)$$

$$I_n = \frac{C_n}{1 + (2F_c/\pi)^2 \sin^2[(\omega - \omega_{cn})L/c]}$$

The coefficients $C_n$ are determined by the mismatching and misalignment of the incoming beam relative to the NCFP. In the simple case of perfect matching but misalignment in the beam direction, this non-perfect alignment can be described with a single real parameter Z. For example, if the beam is parallel but shifted from the cavity axis by the distance y times the beam radius, the misalignment parameter Z is y. For Z>0, higher order transverse modes $TEM_{on}$ as well as the fundamental mode are excited and the coupling coefficients are:

$$C_n = \frac{Z^n \exp(-Z)}{n!} \quad (5)$$

Figure 6:
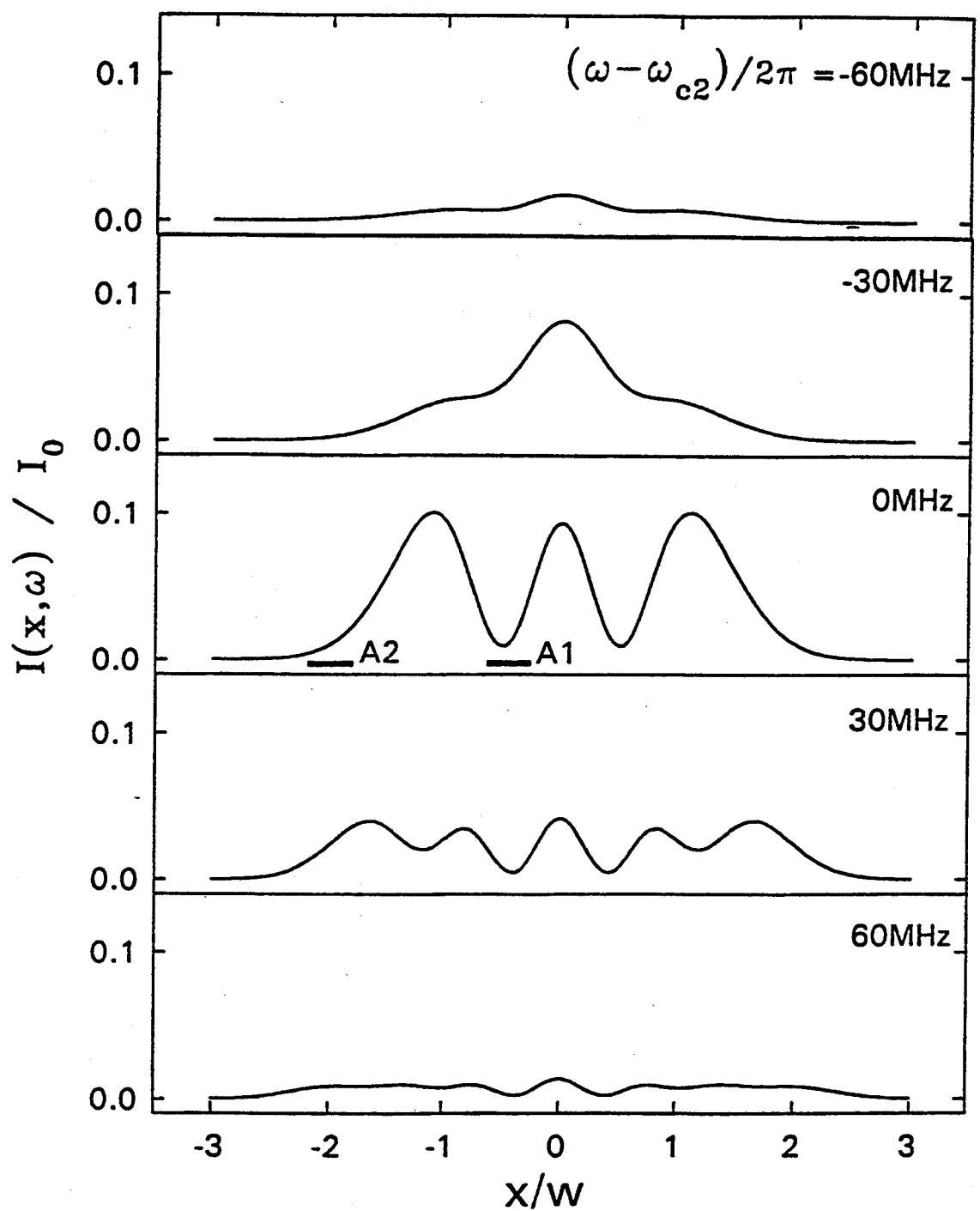
FIG. 6 is a graph of calculated spatial intensity distribution of the transmitted beam of FIG. 5, for five different laser frequency detunings from the $TEM_{02}$ cavity resonance.
Figure 7:
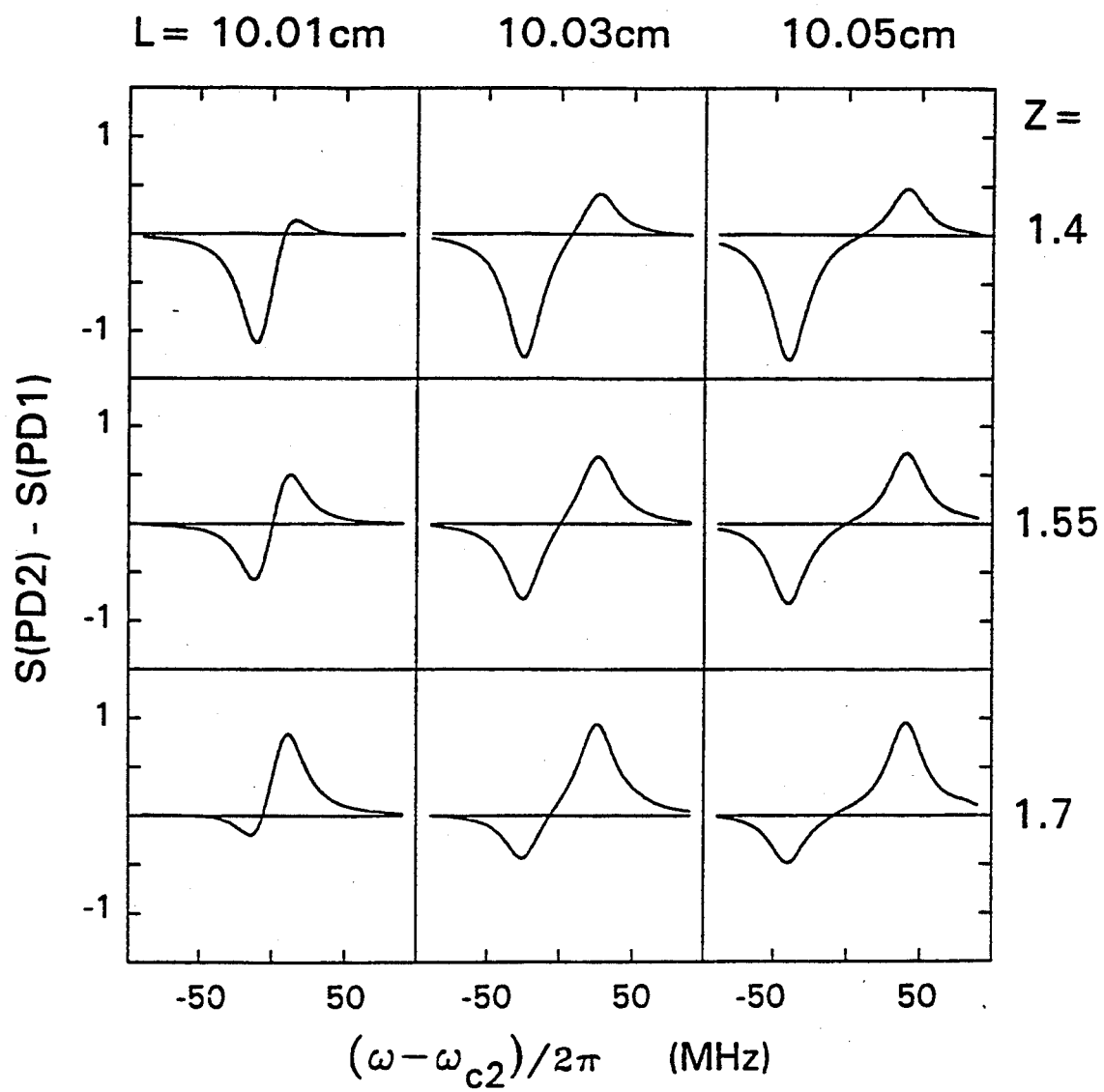
FIG. 7 is a graph of a calculated difference signal $S_{21} = S(PD2) - S(PD1)$ of two photodetectors placed behind the apertures A1, A2 as a function of laser frequency detuning for a set of three different cavity lengths L and misalignment parameter Z; and, FIG. 8 is a graph of difference signal $S_{21}$ as a function of the feedback phase for a feedback stabilized diode laser system.

FIG. 5 shows the calculated intensity of a beam leaving a NCFP of finesse Fc=50, mirror radius r=0.1 m and mirror separation L=0.1005 m. The assumed misalignment parameter Z of the incoming beam is 1.47. If such a cavity and alignment are used in a setup as shown in FIG. 3 for optical self-locking of the laser, the best frequency noise suppression will appear if the laser system frequency $\omega$ (and the free running laser frequency $\omega_0$) is locked to the cavity resonance $\omega_{c2}$, since at this frequency, the real part of the reflection coefficient back into the laser diode has its maximum and the imaginary part changes its sign and has a large positive slope. When the laser frequency $\omega$ is tuned over the NCFP resonances $\omega_{cn}$, not only does the intensity of the transmitted light change, but the transverse mode pattern of the transmitted beam is also altered. The cross section intensity distribution $I(x,\omega)$ of a beam leaving the resonator can be expressed as a superposition of the excited $TEM_{on}$-mode distributions with a relative intensity given by $C_n$ and the cavity Airy-function for $\omega-\omega_{cn}$. FIG. 6 shows the spatial intensity distribution of the transmitted beam for five different laser frequencies $\omega$ close to cavity resonance $\omega_{c2}$, where the transmitted intensity $I(\omega)$ has its absolute maximum. The cavity parameters and the misalignment parameter Z are the same as in FIG. 5. A simple analysis of the spatial mode patterns with two photodetectors looking at different spots of the beam cross section provides a direct way to lock the laser frequency to the cavity resonance $\omega_{c2}$. In FIG. 6, two apertures A1, A2 are indicated under the intensity profile for $(\omega - \omega_{c2})=0$ ) MHz at the positions x1=0.375 w and x2=1.83w, where w is the Gaussian beam radius. The aperture diameters are D1=D2=0.2w. A photodetector placed behind A1 will have its maximum signal S(PD1) for negative detunings $\omega - \omega_{c2}$ near $\omega = \omega_{c0}$ since all even transverse modes $TEM_{0n}$ with $n \geq 2$ have an intensity minima at A1 so that only the fundamental mode contributes a major part to the signal. In contrast, the signal S(PD2) of a photodetector behind A2 has the biggest signal for positive detunings $\omega - \omega_{c2}$ near $\omega = \omega_{c4}$. Since A2 is at a larger distance from the beam axis, the overlap with the $TEM_{00}$ and the $TEM_{02}$ modes is small and with a misalignment of Z=1.47 only the $TEM_{04}$ mode has a significant intensity at the position of A2. The difference signal $S_{21}=S(PD2)-S(PD1)$ between the two photodetectors will be negative for $\omega=\omega_{c0}$, positive for $\omega=\omega_{c4}$ and zero for $\omega \approx \omega_{c2}$ and large detunings $(\omega-\omega_{c2})/2\pi > 100$ MHz. The exact shape of $S_{21}$ as a function of $\omega$ is determined by the misalignment Z, the cavity parameters, and the size and position of the apertures A1, A2. FIG. 7 shows $S_{21}(\omega)$ for the NCFP of FIG. 5 and 6 and for two other NCFP with larger frequency spacing between the even transverse modes. For each cavity, three different misalignments Z are assumed. The positions and diameters of the apertures are the same as in FIG. 5. $S_{21}(\omega)$ can be used directly as an input signal for feedback phase control to stabilize the laser system frequency to $\omega=\omega_{c2}$, where the best frequency noise reduction occurs. FIG. 7, shows the behavior of $S_{21}(\omega)$. The best locking signal is generated for Z=1.55 and L=0.1005 m. For this case, $S_{21}(\omega)$ shows a dispersion like characteristic with a large positive slope at the zero crossing which occurs exactly at $\omega=\omega_{c2}$ and has a nearly symmetric shape. A more detailed investigation showed that this misalignment, together with the chosen location for the apertures, was the best combination for generating a good locking signal. The absolute intensity of the locking signal can be increased with larger aperture diameters (0.2w<D<1.5w) but in this case the difference signal $S_{21}(\omega)$ becomes more asymmetric. The optimum ratio of the mirror radius and distance (L/r) depends on the cavity finesse Fc. For a Finesse Fc>>1 the approximation $$(L/r)_{opt} = 1 \pm \frac{1}{20F_c} \quad (6)$$

is valid. If L is smaller than r, the difference signal $S_{21}(\omega)$ has an inverse symmetry compared with that shown in FIG. 7 due to the frequencies of higher order even modes having lower frequencies than the fundamental mode. In this case, the difference signal $S_{12}(\omega)=S(PD1)-S(PD2)$ must be used for feedback phase control.

Experiments relating to the new method of stabilization were investigated using the a diode laser system similar to the one shown in FIG. 3, employing optical feedback locking from a nearly confocal resonator. The system employed index guided, diode lasers (NEC NDL 3210) which operated in the visible region of 674 nm. The choice of the operating wavelength was such that the developed laser system could be used later in the experimental investigation of a narrow transition in trapped single ions of Sr+. The laser gave approximately 5 mW of power with a free- running, short-term linewidth of 110 MHz±15 MHz. The diode was mounted in a thermoelectrically cooled housing and was powered by a commercial low noise current supply (ILX-LDX3620) which gave better than 1 mA rms noise over a 5 Hz–10 MHz bandwidth at the operating current of 56 mA. Output from the diode was collimated by an objective lens. No effort was made to circularize the beam. The light then encountered a beam splitter with a transmissivity T=0.6. The reflected portion of the beam went to the confocal cavity and the transmitted portion went to the diagnostic apparatus. A Faraday isolator with 30 dB isolation was used at the output of the diode laser system to prevent unwanted light returning to the diode. A mirror mounted on a piezo-electric transducer (PZT) was used to reflect the light from the beamsplitter to the cavity (see FIG. 3). Servo control of the mirror position was used to control the feedback phase between diode and confocal cavity. Care was taken to use a lightweight mirror mounted on a tubular PZT with a mechanical resonance at a reasonably high frequency, so that the first mechanical resonance of the entire mounted mirror assembly occurred at approximately 6 kHz, which allowed sufficient control bandwidth to reduce the greater part of the noise. The pathlength control range was 1.5 min. The nearly confocal feedback cavity used was of a folded, three-mirror configuration in which a flat output coupling mirror was placed between two high reflectivity mirrors with radii r=10 cm. The laser radiation thus entered and exited from the flat output coupler of the V shaped cavity. The folded cavity configuration gave a compact structure, allowed straightforward alignment for coupling into the cavity and avoided reflections from the cavity input mirror feeding back to the laser. The cavity had a finesse $F_c=50$ at 674 nm and a free spectral range of 1.5 GHz. The cavity was fabricated from fused-silica tubes. A tubular PZT within the cavity structure was used for tuning the length of the cavity and hence the output frequency of the feedback-locked diode. In order to prevent thermal drifts, the cavity structure was surrounded by thermal insulation. The diode laser, beamsplitter, phase mirror, and confocal cavity were mounted on a common base and top plate made of super-invar to maximize the passive stability of the structure.

To detect the cavity mode patterns used in the feedback phase servo, the beam profiles which emerged from the high reflectivity mirrors of the confocal cavity were incident upon two photodiodes (Motorola MRD 300) located behind 1.0 mm diameter apertures. The photodetector systems (PD1, PD2) were located approximately at the positions in the cavity-mode pattern shown in FIG. 6. Since the V-cavity configuration allowed for the output spots from each of the two high reflectivity mirrors to be accessible, each aperture/photodiode was placed at the exit of a different high reflector mirror. This arrangement gave an added advantage of allowing the detectors to be positioned independently anywhere in the beam pattern with no limitation due to the size of the detector head. A cavity to aperture distance of 12 cm was used. The output from the two photodiodes was then sent into a differential amplifier followed by an integrator stage. When the servo loop was closed, the output from the integrator fed the input of a high voltage amplifier driving the phase mirror PZT. The open loop servo gain was unity at 5 kHz, and the amplitude response slope was −20 dB/decade over the principal range of operating frequencies.

Figure 8:
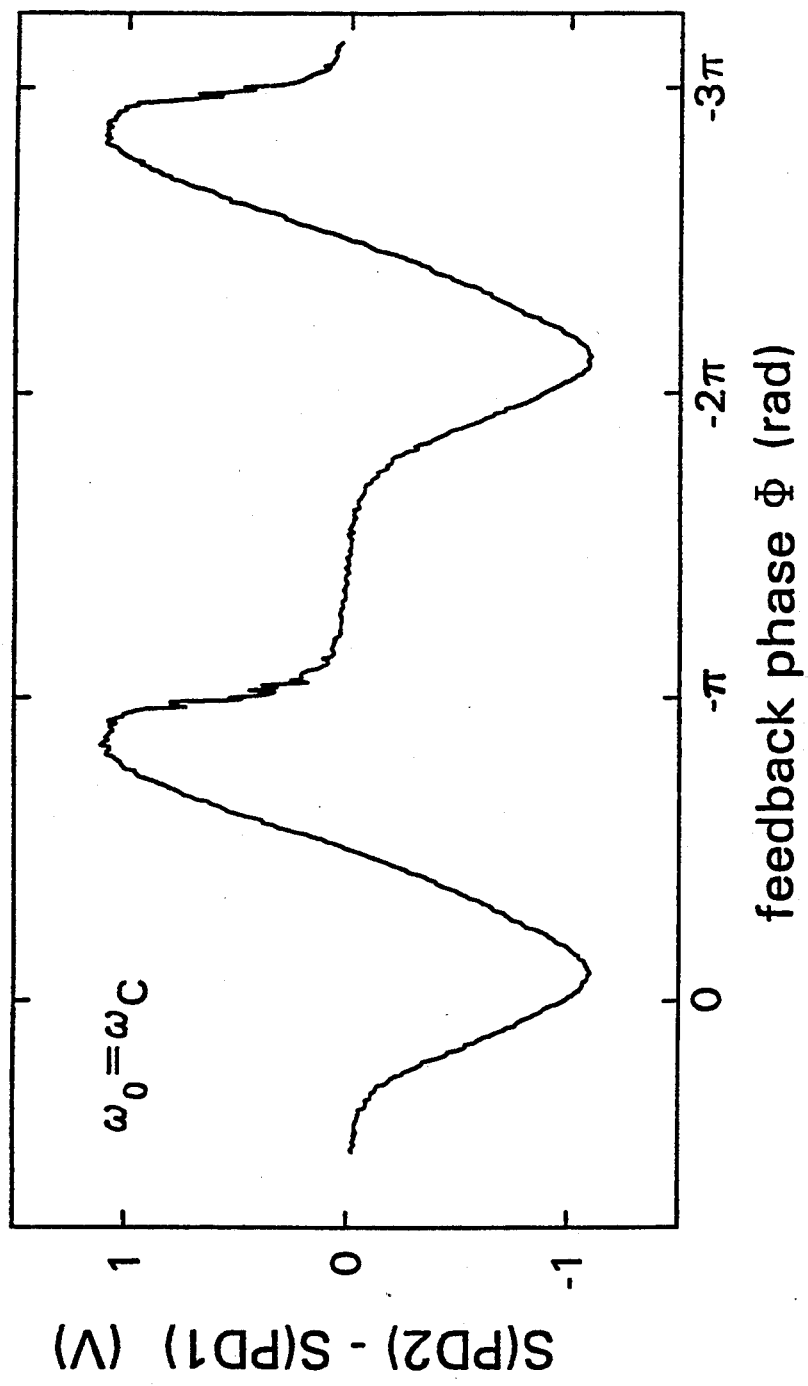

For optical feedback into the diode laser, the confocal resonator was used off axis, which reduced coupling into the laser. Optimum feedback locking was obtained when the laser collimating lens was adjusted so that a beam waist was produced at the input mirror of the V-cavity, which optimized mode coupling. As an initial step, the laser injection current was adjusted so that the free running frequency matched the cavity resonance ($\omega_0=\omega_c$). The total level of feedback was such that stable, single-mode operation was obtained. The phase mirror was then ramped back and forth thus ramping $\omega$ and the feedback phase; the resulting photodiode signals as a function of the feedback phase were then observed. Fine adjustments of the detector position were then made to maximize the difference in the observed PD 1 and PD2 signals. Once optimized, the servo error signal from the photodiodes (shown in FIG. 8) was observed with the predicted zero crossing at $\phi=-\pi/2$ when the phase mirror was moved in the vicinity of the optimum locking point. The signal varied linearly over a range corresponding to a change in system frequency of 8 MHz (via variation of the phase mirror position), illustrating that control over a relatively large range of excursion can be obtained. The form of the error signal agrees very well with that predicted by the theory for a cavity that departs slightly from confocality (see calculation for L=10.01 cm in FIG. 7) and has the cavity misalignment adjusted for an optimum symmetry in the error signal (Z=1.55 in FIG. 7). Obtaining a more quantitative comparison between the observed signal and theory would require better knowledge of the experimental mode matching and misalignment parameters, a more accurate characterization of the non-Gaussian diode laser beam shape together with a more extensive theoretical treatment, taking into account the effect of higher order cavity modes being excited.

With the phase-mirror control loop closed, the optical feedback lock was stable for periods of more than an hour, with no adjustment of the laser diode current. When no phase mirror control loop was employed, the system would remain in lock for periods of the order of 100 s; the feedback phase would then need adjustment to regain lock.

In order to observe the frequency stability of the device, two identical units were constructed and their relative frequencies compared by their beat spectrum on a fast photodiode. From these results, it was found that the phase-mirror locking technique provided a significant improvement in frequency stability over a system with no servo active. Improvements in the frequency stability of over an order of magnitude were observed, keeping the fractional frequency excursions below $1 \times 10^{-9}$.

Of course, numerous other embodiments could be envisaged without departing from the spirit and scope of the invention.

What we claim is:

1. A method of providing a control signal comprising the steps of:
   a) providing a resonant cavity having a plurality of longitudinal and transverse modes inherently associated with resonance of the cavity;
   b) providing the resonant cavity with an optical signal having a spatial intensity mode pattern that is suitable for excitation of at least one of the longitudinal modes and a plurality of associated transverse modes of the cavity;
   c) allowing a plurality of the transverse modes to become excited within the resonant cavity in the presence of the optical signal, each transverse mode having a resonant frequency;
   d) detecting relative intensities of a selected plurality of transverse modes that are excited within the cavity; and
   e) generating a control signal by comparing the relative intensities determined in step (c), the control signal being representative of the relative frequency difference between the optical signal and the resonance of the resonant cavity.

2. A method as defined in claim 1, wherein the step of determining the relative intensities of the plurality of the transverse modes includes the step of detecting at a plurality of locations adjacent the cavity, the power of the plurality of transverse modes that are excited within the cavity.

3. A method as defined in claim 2, wherein the step of detecting is performed by a plurality of optical detectors.

4. A method as defined in claim 1, comprising the step of varying one of the frequency of the optical signal and the resonant frequency of the resonant cavity in dependence upon the intensity of the control signal.

5. A method as defined in claim 1, further comprising the step of relatively locking the resonant frequency of the resonant cavity to the frequency of the optical signal by providing the control signal as a feedback signal to the resonant cavity.

6. An apparatus for providing a control signal characteristic of a relative frequency of an optical signal with a resonance of a resonant cavity having a plurality of associated transverse modes, comprising:
   laser means for generating an optical signal, the optical signal having a spatial intensity mode pattern for excitation of the plurality of associated transverse modes of the resonant cavity;
   the resonant cavity having an input port for receiving the optical signal from the laser means, and having an output port for accepting the optical signal after it has been excited within the resonant cavity; means for detecting at a plurality of locations the intensities of a plurality of transverse modes excited within the cavity after propagating through the output port of the resonant cavity; and, means for transforming the detected intensities into a control signal for controlling a characteristic of one of the laser means and the resonant cavity.

7. An apparatus as defined in claim 6, wherein the laser means and the resonant cavity are a part of a same optical resonator for the laser source in which the derived control signal is used to maintain resonance.

8. An apparatus as defined in claim 6 including a non-linear optical medium within the resonant cavity for enhancing the generation of harmonic radiation.

* * * * *